United States Patent
Su

(10) Patent No.: US 9,934,179 B2
(45) Date of Patent: Apr. 3, 2018

(54) WAFER-LEVEL PACKAGE WITH AT LEAST ONE INPUT/OUTPUT PORT CONNECTED TO AT LEAST ONE MANAGEMENT BUS

(71) Applicant: MEDIATEK INC., Hsin-Chu (TW)

(72) Inventor: Yao-Chun Su, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/043,611

(22) Filed: Feb. 14, 2016

(65) Prior Publication Data
US 2016/0240507 A1   Aug. 18, 2016

Related U.S. Application Data

(60) Provisional application No. 62/117,086, filed on Feb. 17, 2015.

(51) Int. Cl.
| | |
|---|---|
| *H01L 21/44* | (2006.01) |
| *G06F 13/368* | (2006.01) |
| *G06F 13/40* | (2006.01) |
| *H01L 23/498* | (2006.01) |
| *H01L 25/065* | (2006.01) |

(52) U.S. Cl.
CPC ........ *G06F 13/368* (2013.01); *G06F 13/4068* (2013.01); *H01L 23/49811* (2013.01); *H01L 23/49838* (2013.01); *H01L 25/065* (2013.01); *H01L 2225/06506* (2013.01); *H01L 2225/06527* (2013.01)

(58) Field of Classification Search
CPC ... H01L 2224/16225; H01L 2224/3225; H01L 2224/73265; H01L 2224/48091; H01L 2224/48227; H01L 2224/73204; H01L 2224/32145; H01L 23/49816; H01L 23/3128; H01L 23/49827; H01L 23/481; H01L 23/50; H01L 25/18; H01L 25/105; H01L 25/0657
See application file for complete search history.

(56) References Cited

U.S. PATENT DOCUMENTS

| | | | |
|---|---|---|---|
| 4,912,633 | A | 3/1990 | Schweizer |
| 5,613,077 | A | 3/1997 | Leung |
| 6,317,804 | B1 | 11/2001 | Levy |
| 7,911,952 | B1 | 3/2011 | Nygreen |
| 9,287,208 | B1 | 3/2016 | Khare |
| 2002/0181455 | A1 | 12/2002 | Norman |
| 2003/0043790 | A1 | 3/2003 | Gutierrez |
| 2005/0083217 | A1 | 4/2005 | Kim |
| 2005/0094927 | A1 | 5/2005 | Kish, Jr. |
| 2009/0077289 | A1 | 3/2009 | Pagan |

(Continued)

FOREIGN PATENT DOCUMENTS

| | | |
|---|---|---|
| EP | 0 866 404 A2 | 9/1998 |
| EP | 0 866 404 A3 | 9/2002 |

*Primary Examiner* — (Vikki) Hoa B Trinh
(74) *Attorney, Agent, or Firm* — Winston Hsu

(57) ABSTRACT

A wafer-level package has a first input/output (I/O) port, a second I/O port, a first semiconductor die, and a second semiconductor die. The first I/O port and the second I/O port of the wafer-level package are arranged to connect at least one management bus. The first semiconductor die and the second semiconductor die assembled in the wafer-level package are arranged to receive commands from the first I/O port and the second I/O port, respectively.

20 Claims, 4 Drawing Sheets

(56) References Cited

U.S. PATENT DOCUMENTS

| | | |
|---|---|---|
| 2009/0103345 A1 | 4/2009 | McLaren |
| 2010/0174936 A1 | 7/2010 | Hill |
| 2011/0202799 A1 | 8/2011 | Pagani |
| 2011/0208906 A1 | 8/2011 | Gillingham |
| 2012/0068360 A1 | 3/2012 | Best |
| 2014/0192583 A1* | 7/2014 | Rajan ............... G11C 7/10 365/63 |
| 2015/0185282 A1 | 7/2015 | Wang |

* cited by examiner

… (1)

WAFER-LEVEL PACKAGE WITH AT LEAST ONE INPUT/OUTPUT PORT CONNECTED TO AT LEAST ONE MANAGEMENT BUS

CROSS REFERENCE TO RELATED APPLICATIONS

This application claims the benefit of U.S. provisional application No. 62/117,086 (filed on Feb. 17, 2015). The entire content of the related application is incorporated herein by reference.

BACKGROUND

The present invention relates to a chip design, and more particularly, to a wafer-level package with at least one input/output port connected to at least one management bus.

When a chip function of a target chip is achieved using a large-sized die, the fabrication of large-sized dies on a wafer will suffer from low yield and high cost. Given the same die area, the yield of one large die is lower than the yield of multiple small dies. More specifically, assuming that distribution of defects on a wafer is the same, a die yield of one large-sized die fabricated on the wafer is lower than a die yield of multiple small-sized dies which have the same area fabricated on the same wafer. However, splitting one large die into multiple smaller dies may bring some overhead. For example, a large number of signals will be introduced to achieve communications between different small-sized dies assembled in the same package. Further, a communication channel between two small-sized dies is required to undergo a calibration procedure before the actual data transaction can be carried out through the communication channel. Thus, there is a need for an innovative design which can achieve calibration of a communication channel between two dies assembled in the same package.

SUMMARY

One of the objectives of the claimed invention is to provide a wafer-level package with at least one input/output port connected to at least one management bus.

According to a first aspect of the present invention, an exemplary wafer-level package is disclosed. The exemplary wafer-level package includes a first input/output (I/O) port, a second I/O port, a first semiconductor die, and a second semiconductor die. The first I/O port and the second I/O port of the wafer-level package are arranged to connect at least one management bus. The first semiconductor die and the second semiconductor die assembled in the wafer-level package are arranged to receive commands from the first I/O port and the second I/O port, respectively.

According to a second aspect of the present invention, an exemplary wafer-level package is disclosed. The exemplary wafer-level package includes an I/O port, a first semiconductor die, and a second semiconductor die. The I/O port of the wafer-level package is arranged to connect only a single management bus. Each of the first semiconductor die and the second semiconductor die assembled in the wafer-level package is arranged to receive commands from the I/O port.

According to a third aspect of the present invention, an exemplary wafer-level package is disclosed. The exemplary wafer-level package includes an I/O port, a first semiconductor die, and a second semiconductor die. The I/O port of the wafer-level package is arranged to connect only a single management bus. The first semiconductor die is arranged to receive commands from the I/O port and operate according to a first portion of the received commands. The second semiconductor die is arranged to receive a second portion of the received commands from the first semiconductor die.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
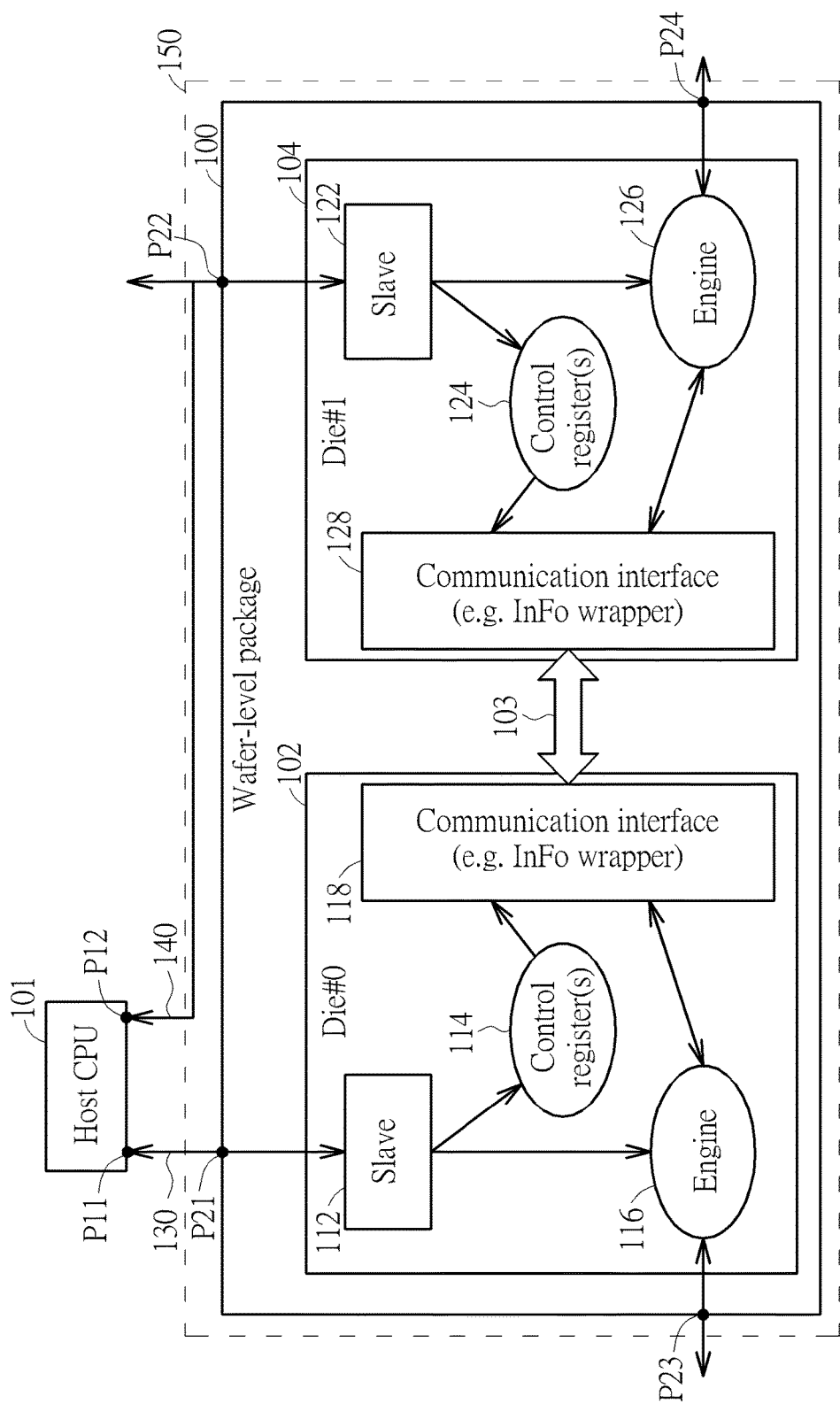
FIG. 1 is a diagram illustrating a wafer-level package according to a first embodiment of the present invention.

FIG. 1 is a diagram illustrating a wafer-level package according to a first embodiment of the present invention. In this embodiment, a single wafer-level package 100 is connected to a host central processing unit (CPU) 101, and has multiple semiconductor dies, such as two semiconductor dies (denoted by Die#0 and Die#1) 102 and 104, assembled therein. For example, the wafer-level package 100 is an integrated fan-out (InFO) package or a chip on wafer on substrate (CoWoS) package, and/or the semiconductor dies 102 and 104 are assembled in the wafer-level package 100 to perform a network switch function. However, this is for illustrative purposes only, and is not meant to be a limitation of the present invention.

Wafer-level packaging is the technology of packaging semiconductor dies, which is different from a typical packaging method of slicing a wafer into individual semiconductor dies and then packaging the individual semiconductor dies. The wafer-level package mentioned above is therefore fabricated based on wafer-level process. That is, semiconductor dies (e.g., homogeneous dies or heterogeneous dies) assembled in the same wafer-level package and connection paths/communication buses/communication channels routed between the semiconductor dies are fabricated with wafer-level process. Hence, connection paths, communication buses, or communication channels could be implemented by metal layer (such as RDL metal layer, Re-Distribution Layer, a metal layer on a die that makes the I/O pads of an integrated circuit available in other locations) rather than bonding wire.

Take InFO packages as examples for the following wafer-level packages (e.g., 100, 200, 300, 400), but not for a limitation. Since a wafer-level package using the proposed flow control mechanism may be an InFO package or a CoWoS package, "InFO package" and "CoWoS package" may be interchangeable, and "InFO bus" and "CoWoS bus" may be interchangeable.

As shown in FIG. 1, the host CPU 101 has a plurality of management ports P11 and P12 connected to a plurality of separate management buses 130 and 140, respectively. The wafer-level package (e.g., InFO package) 100 has a plurality of input/output (I/O) ports (e.g., I/O pads) P21 and P22 connected to the separate management buses 130 and 140, respectively. The semiconductor dies 102 and 104 assembled in the same wafer-level package 100 are arranged to receive commands from the I/O ports P21 and P22, respectively.

It is noted that the semiconductor dies 102 and 104 may be homogeneous dies or heterogeneous dies, depending upon actual design considerations. For clarity and simplicity, the following assumes that the semiconductor die 102 is identical the semiconductor die 104. Hence, the yield rate can be improved by dividing a large die into small dies and the implementation cost can be reduced by using homogeneous dies.

With regard to the semiconductor die 102, it includes a control circuit (denoted by "Slave") 112, one or more control register(s) 114, an engine 116, and a communication interface 118. With regard to the semiconductor die 104, it includes a control circuit (denoted by "Slave") 122, one or more control register(s) 124, an engine 126, and a communication interface 128. The semiconductor dies 102 and 104 can communicate with each other via a communication channel 103 connected between communication interfaces 118 and 128. For example, the communication channel is an InFO channel, and communication interfaces 118 and 128 are InFO wrappers.

The host CPU 101 may act as a master device, and the semiconductor dies 102 and 104 may act as slave devices controlled by the master device. Hence, the host CPU 101 may generate commands to the semiconductor dies 102 and 104 through the management buses 130 and 140. In one exemplary design, calibration commands needed by a calibration procedure may be transmitted over the management buses 130 and 140 for calibrating the communication interfaces 118 and 128 of the semiconductor dies 102 and 104 to ensure that data transaction can be correctly carried out through the communication channel 103. For example, the calibration procedure is used to find out characteristics of process corner, temperature and voltage and configure one good timing window for an InFO clock that is used to drive/sample InFO data.

In this embodiment, two separate management buses 130 and 140 are employed, where one management bus 130 is used to transmit commands (e.g., calibration commands) from the host CPU 101 to one semiconductor die 102, and the other management bus 140 is used to transmit commands (e.g., calibration commands) from the host CPU 101 to the other semiconductor die 104. In addition, the host CPU 101 generates commands with identifiers (IDs) for command identification at the semiconductor dies 102 and 104. For example, the host CPU 101 may add an identifier of the semiconductor die 102 to each command transmitted over the management bus 130, and may add an identifier of the semiconductor die 104 to each command transmitted over the management bus 140.

It should be noted that the wafer-level package 100 is installed on a circuit board (e.g., a printed circuit board) 150, and at least a portion of the management buses 130 and 140 is routed on the circuit board 150 to thereby route the commands issued from the host CPU 101 to the I/O ports P21 and P22 of the wafer-level package 100.

When the calibration procedure begins, the host CPU 101 uses the management bus 130 to access (read/write) the control register(s) 114 of the semiconductor die 102, and uses the management bus 140 to access (read/write) the control register(s) 124 of the semiconductor die 104. Specifically, the host CPU 101 issues calibration commands to instruct the control circuit 112 to access (read/write) the control register(s) 114.

For example, the control register(s) 114 may be set to configure/change the clock timing used by the communication interface 118 to generate test patterns to the communication interface 128 via the communication channel 103, and the control register(s) 124 may be set to configure/change the clock timing used by the communication interface 128 to receive the test patterns from the communication channel 103. For another example, the control register(s) 124 may be set to configure/change the clock timing used by the communication interface 128 to generate test patterns to the communication interface 118 via the communication channel 103, and the control register(s) 114 may be set to configure/change the clock timing used by the communication interface 118 to receive the test patterns from the communication channel 103. To put it simply, the calibration procedure is used to measure and correct the interface timing window between the communication interfaces 118 and 128. After the communication interfaces 118 and 128 are properly calibrated, data transmitted from one of the communication interfaces 118 and 128 can be correctly sampled by the other of the communication interfaces 118 and 128. In this way, a reliable communication channel 103 can be established after the calibration procedure is done.

As mentioned above, the semiconductor dies 102 and 104 assembled in the same wafer-level package 100 can perform data transaction through the on-chip communication channel 103. The semiconductor dies 102 and 104 can further perform data transaction with external circuits. For example, the engine 116 of the semiconductor die 102 may be used to generate data for the semiconductor die 104 via the communication interface 118, and may be used to receive data from the semiconductor die 104 via the communication interface 118. In addition, the engine 116 of the semiconductor die 102 may be used to generate data to an external circuit (not shown) via an I/O port (e.g., I/O pad) P23 of the wafer-level package 100 and may be used to receive data from the external circuit (not shown) via the I/O port P23 of the wafer-level package 100.

Similarly, the engine 126 of the semiconductor die 104 may be used to generate data for the semiconductor die 102 via the communication interface 128, and may be used to receive data from the semiconductor die 102 via the communication interface 128. Further, the engine 126 of the semiconductor die 104 may be used to generate data to an external circuit (not shown) via an I/O port (e.g., I/O pad) P24 of the wafer-level package 100 and may be used to receive data from the external circuit (not shown) via the I/O port P24 of the wafer-level package 100.

Since the present invention focuses on management bus arrangement and calibration command delivery, further details of the calibration procedure of the communication interfaces 118 and 128 and the internal circuit structures of the semiconductor dies 102 and 104 are omitted here for brevity.

Figure 2:
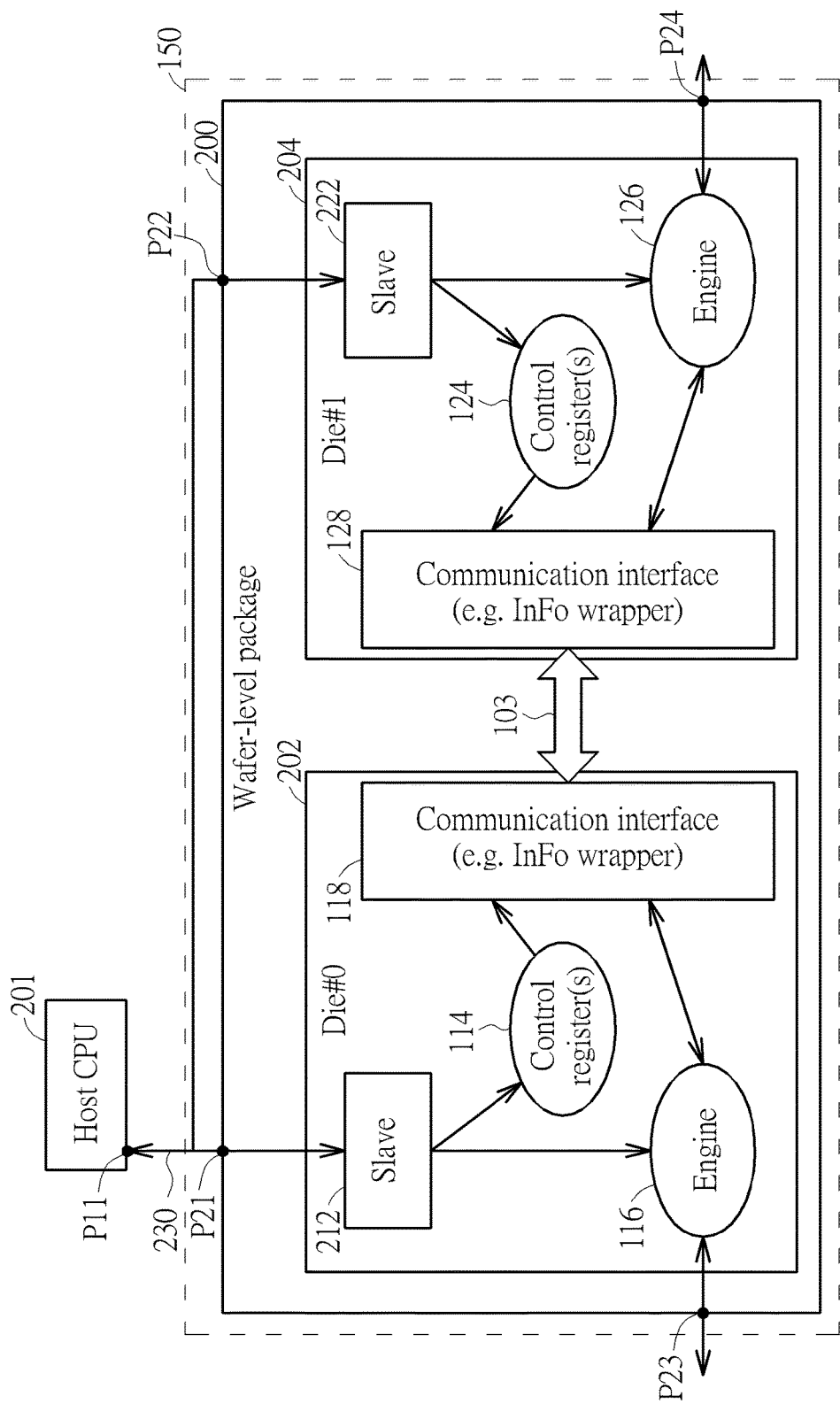
FIG. 2 is a diagram illustrating a wafer-level package according to a second embodiment of the present invention.

FIG. 2 is a diagram illustrating a wafer-level package according to a second embodiment of the present invention.

In this embodiment, a single wafer-level package 200 is connected to a host CPU 201, and has multiple semiconductor dies, such as two semiconductor dies (denoted by Die#0 and Die#1) 202 and 204, assembled therein. For example, the wafer-level package 200 is an integrated fan-out (InFO) package, and/or the semiconductor dies 202 and 204 are assembled in the wafer-level package 200 to perform a network switch function. However, this is for illustrative purposes only, and is not meant to be a limitation of the present invention. Any wafer-level package using the proposed design to receive commands from a host processor falls within the scope of the present invention.

The semiconductor dies 202 and 204 assembled in the same wafer-level package 200 are arranged to receive commands (e.g., calibration commands) from I/O ports P21 and P22, respectively. The semiconductor dies 202 and 204 may be homogeneous dies or heterogeneous dies, depending upon actual design considerations. For clarity and simplicity, the following assumes that the semiconductor die 202 is identical the semiconductor die 204. Hence, the yield rate can be improved by dividing a large die into small dies and the implementation cost can be reduced by using homogeneous dies.

The major difference between the wafer-level packages 100 and 200 is that the semiconductor dies 202 and 204 receive commands (e.g., calibration commands) from the host CPU 201 via only a single management bus 230. That is, the semiconductor dies 202 and 204 are connected to the same management bus 230. Hence, the host CPU 201 has one management port P11 connected to the management bus 230, and the I/O ports (e.g., I/O pads) P21 and P22 of the wafer-level package 200 are connected to the same management bus 230. In this embodiment, the wafer-level package 200 is installed on the circuit board (e.g., printed circuit board) 150, and at least a portion of the management bus 230 is routed on the circuit board 150 to thereby route all commands issued from the host CPU 101 to each of the I/O ports P21 and P22 of the wafer-level package 200. Comparing to the proposed design shown in FIG. 1, the proposed design shown in FIG. 2 uses fewer management buses to thereby save management ports on the host CPU 201.

Though the same management bus 230 is shared by different semiconductor dies 202 and 204, commands can be identified by associated identifiers (IDs). That is, the host CPU 201 may generate commands with IDs for command identification at the semiconductor dies 202 and 204. For example, the host CPU 201 may add an identifier of the semiconductor die 202 to each command intended to be received by the semiconductor die 202, and may add an identifier of the semiconductor die 204 to each command intended to be received by the semiconductor die 204. Hence, the control circuit (denoted by "Slave") 212 of the semiconductor die 202 may check identifiers associated with commands transmitted over the shared management bus 230 to extract commands intended to be received by the semiconductor die 202 and ignore/drop commands intended to be received by the semiconductor die 204. Similarly, the control circuit (denoted by "Slave") 222 of the semiconductor die 204 may check identifiers associated with commands transmitted over the shared management bus 230 to extract commands intended to be received by the semiconductor die 204 and ignore/drop commands intended to be received by the semiconductor die 202.

Since the present invention focuses on management bus arrangement and calibration command delivery, further details of the calibration procedure of the communication interfaces 118 and 128 and the internal circuit structures of the semiconductor dies 202 and 204 are omitted here for brevity.

Figure 3:
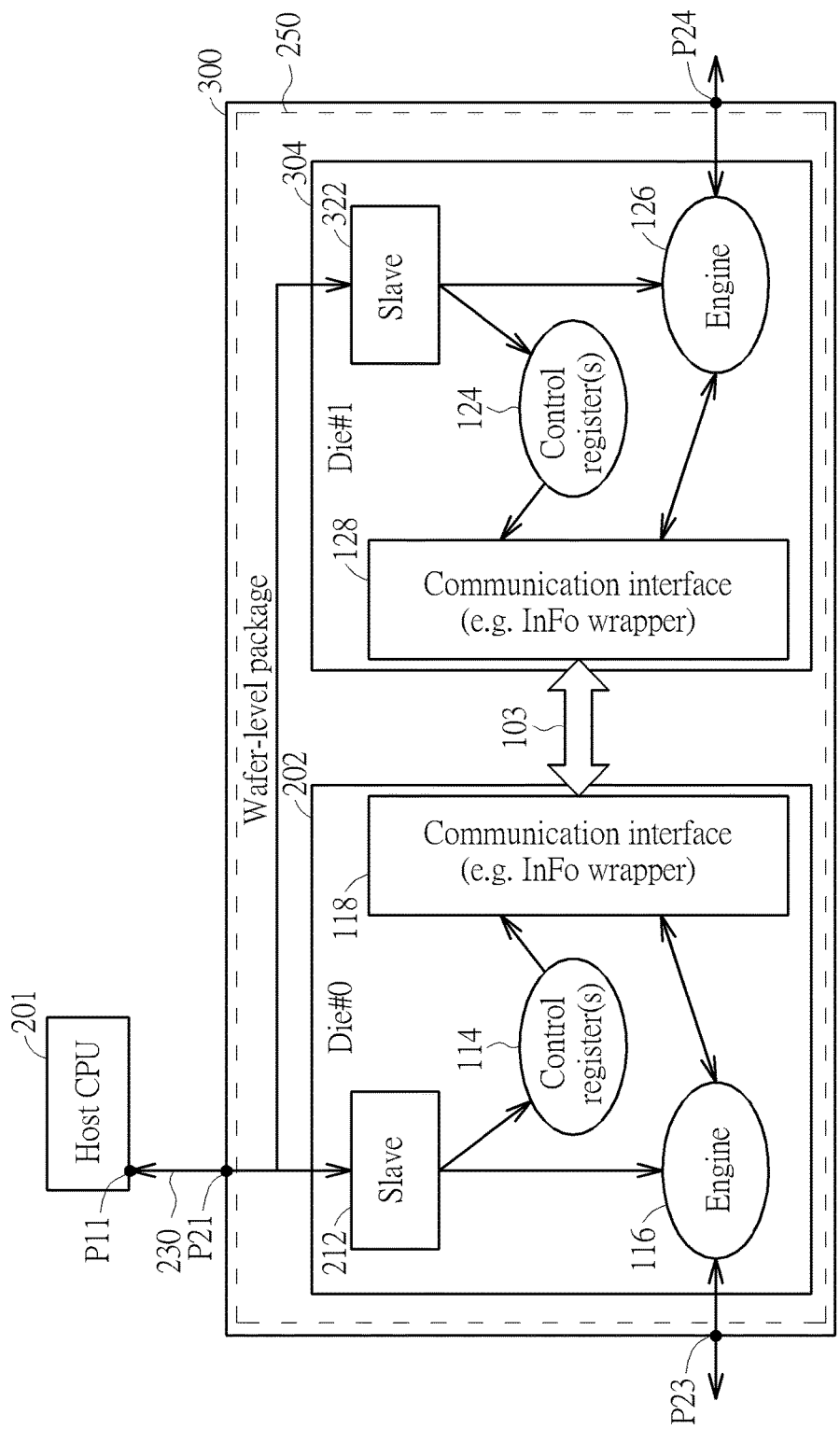
FIG. 3 is a diagram illustrating a wafer-level package according to a third embodiment of the present invention.

FIG. 3 is a diagram illustrating a wafer-level package according to a third embodiment of the present invention. In this embodiment, a single wafer-level package 300 is connected to the host CPU 201, and has multiple semiconductor dies, such as two semiconductor dies (denoted by Die#0 and Die#1) 202 and 304, assembled therein. For example, the wafer-level package 300 is an integrated fan-out (InFO) package, and/or the semiconductor dies 202 and 304 are assembled in the wafer-level package 300 to perform a network switch function. However, this is for illustrative purposes only, and is not meant to be a limitation of the present invention. Any wafer-level package using the proposed design to receive commands from a host processor falls within the scope of the present invention.

The semiconductor dies 202 and 304 may be homogeneous dies or heterogeneous dies, depending upon actual design considerations. For clarity and simplicity, the following assumes that the semiconductor die 202 is identical the semiconductor die 304. Hence, the yield rate can be improved by dividing a large die into small dies and the implementation cost can be reduced by using homogeneous dies.

The major difference between the wafer-level packages 200 and 300 is that the semiconductor dies 202 and 304 assembled in the same wafer-level package 300 are arranged to receive commands (e.g., calibration commands) from the same I/O port P21 connected to only a single management bus 230. As shown in FIG. 3, all commands arriving at the I/O port P21 are received by the control circuit (denoted by "Slave") 212 of the semiconductor die 202 and the control circuit (denoted by "Slave") 322 of the semiconductor die 304. In this embodiment, the wafer-level package 300 has a substrate 250 arranged to carry the semiconductor dies 202 and 304, and at least a portion of the management bus 230 is routed on the substrate 250 to thereby route all commands received by the I/O port P21 to each of the control circuits 212 and 322 inside the wafer-level package 300. Compared to the proposed design shown in FIG. 2, the proposed design shown in FIG. 3 uses the substrate routing to take the place of the circuit board routing, thus reducing the hardware implementation cost.

Though the same management bus 230 is shared by different semiconductor dies 202 and 304, commands can be identified by associated identifiers (IDs). The host CPU 201 may generate commands with identifiers (IDs) for command identification at the semiconductor dies 202 and 304. For example, the host CPU 201 may add an identifier of the semiconductor die 202 to each command intended to be received by the semiconductor die 202, and may add an identifier of the semiconductor die 304 to each command intended to be received by the semiconductor die 304. Hence, the control circuit (denoted by "Slave") 212 of the semiconductor die 202 may check identifiers associated with commands received from the I/O port P21 to extract commands intended to be received by the semiconductor die 202 and ignore/drop commands intended to be received by the semiconductor die 304. Similarly, the control circuit (denoted by "Slave") 322 of the semiconductor die 304 may check identifiers associated with commands received from the I/O port P21 to extract commands intended to be received by the semiconductor die 304 and ignore/drop commands intended to be received by the semiconductor die 202.

Since the present invention focuses on management bus arrangement and calibration command delivery, further details of the calibration procedure of the communication interfaces 118 and 128 and the internal circuit structures of the semiconductor dies 202 and 304 are omitted here for brevity.

Figure 4:
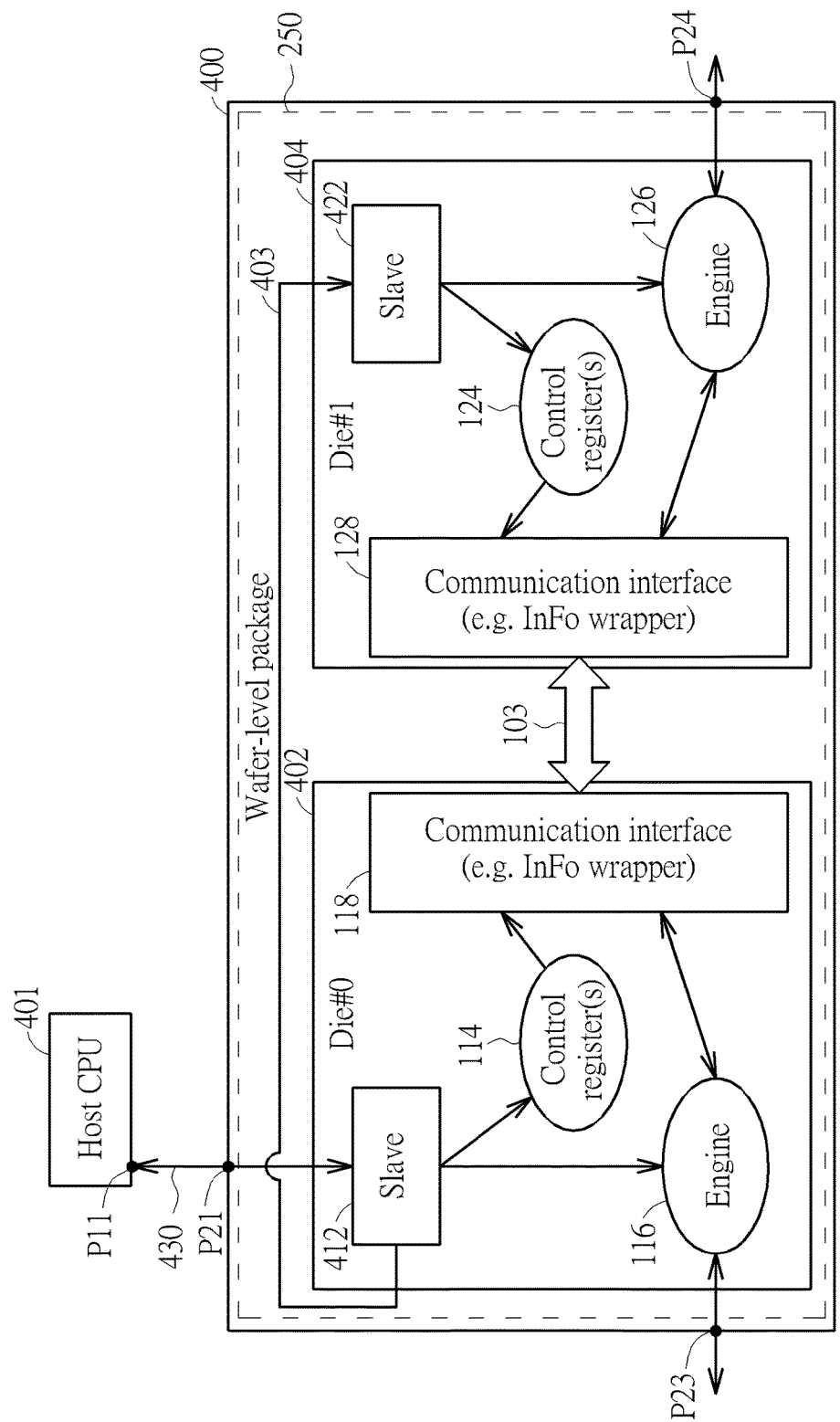
FIG. 4 is a diagram illustrating a wafer-level package according to a fourth embodiment of the present invention.

FIG. 4 is a diagram illustrating a wafer-level package according to a fourth embodiment of the present invention. In this embodiment, a single wafer-level package 400 is connected to a host CPU 401, and has multiple semiconductor dies, such as two semiconductor dies (denoted by Die#0 and Die#1) 402 and 404, assembled therein. For example, the wafer-level package 400 is an integrated fan-out (InFO) package, and/or the semiconductor dies 402 and 404 are assembled in the wafer-level package 400 to perform a network switch function. However, this is for illustrative purposes only, and is not meant to be a limitation of the present invention. Any wafer-level package using the proposed design to receive commands from a host processor falls within the scope of the present invention.

The semiconductor dies 402 and 404 may be homogeneous dies or heterogeneous dies, depending upon actual design considerations. For clarity and simplicity, the following assumes that the semiconductor die 402 is identical the semiconductor die 404. Hence, the yield rate can be improved by dividing a large die into small dies and the implementation cost can be reduced by using homogeneous dies.

The major difference between the wafer-level packages 300 and 400 is that the semiconductor die 402 in the wafer-level package 400 is arranged to receive all commands (e.g., calibration commands) from the I/O port P21 connected to only a single management bus 430 and operate according to a first portion of the received commands, and the semiconductor die 404 in the same wafer-level package 400 is arranged to receive a second portion of the received commands from the semiconductor die 402. That is, the semiconductor die 402 may act as a master die, while the semiconductor die 404 may act as a slave die. In this embodiment, the wafer-level package 400 has a substrate 250 arranged to carry the semiconductor dies 402 and 404. At least a portion of the management bus 430 is routed on the substrate 250 to thereby route all commands received by the I/O port P21 to the control circuit 412 inside the wafer-level package 400.

In addition, a low-speed channel 403 different from the high-speed communication channel 103 to be calibrated by the calibration procedure is also routed on the substrate 250 to thereby connect the semiconductor die 402 to the semiconductor die 404 for re-directing the slave die access (i.e., the second portion of the received commands) to the semiconductor die 404. Further, the host CPU 401 may enable an error handling mechanism when the slave die access fails. It is noted that the low-speed channel 403 can be a serial bus or a parallel bus.

Since only one of the semiconductor dies 402 and 404 receives commands (e.g., calibration commands) from the host CPU 401 via the management bus 430, the same identifier can be assigned to each command issued from the host CPU 401, thus reducing complexity of management software running on the host CPU 401. Alternatively, since commands transmitted from the management port P11 of the host CPU 401 are received by the semiconductor die 402 only, the host CPU 401 may generate each command without assigning an identifier thereto. Compared to the proposed design shown in FIG. 3, the proposed design shown in FIG. 4 uses fewer identifiers to reduce the management software complexity.

In this embodiment, the semiconductor die 402 is arranged to differentiate between the first portion of the received commands and the second portion of the received commands according to designated addresses of the commands (i.e., read/write addresses associated with the commands issued from the host CPU 401). For example, when a read/write address associated with a specific command is to read/write the control register(s) 114 of the semiconductor die 402, the control circuit 412 of the semiconductor die 402 classifies the specific command into the first portion of the received commands.

For another example, when a read/write address associated with a specific command is to read/write the control register(s) 124 of the semiconductor die 404, the control circuit 412 of the semiconductor die 402 finds that the specific command is not intended to read/write the control register(s) 114 of the semiconductor die 402, and thus classifies the specific command into the second portion of the received commands that will be re-directed to the control circuit 422 of the semiconductor die 404 via the low-speed channel 403.

Since the present invention focuses on management bus arrangement and calibration command delivery, further details of the calibration procedure of the communication interfaces 118 and 128 and the internal circuit structures of the semiconductor dies 402 and 404 are omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer-level package, fabricated in wafer-level process, comprising:
    a first input/output (I/O) port;
    a second I/O port, wherein the first I/O port and the second I/O port of the wafer-level package are arranged to connect at least one management bus;
    a first semiconductor die;
    a second semiconductor die, wherein the first semiconductor die and the second semiconductor die assembled in the wafer-level package are arranged to receive commands from the first I/O port and the second I/O port, respectively; and
    a communication channel, for connecting the first semiconductor die and the second semiconductor die, wherein the communication channel is a re-distribution layer (RDL) metal layer or a metal layer on a die.

2. The wafer-level package of claim 1, wherein the wafer-level package is an integrated fan-out (InFO) package.

3. The wafer-level package of claim 1, wherein the first semiconductor die and the second semiconductor die are homogeneous dies.

4. The wafer-level package of claim 1, wherein each of the first semiconductor die and the second semiconductor die comprises a communication interface, the first semiconductor die and the second semiconductor die communicate with each other via a communication channel connected between communication interfaces of the first semiconductor die and the second semiconductor die, and the commands comprise calibration commands for calibrating the communication interfaces of the first semiconductor die and the second semiconductor die.

5. The wafer-level package of claim 1, wherein the first I/O port is arranged to connect a first management bus, and the second I/O port is arranged to connect a second management bus separated from the first management bus.

6. The wafer-level package of claim 1, wherein the first I/O port and the second I/O port are arranged to connect a same management bus.

7. The wafer-level package of claim 6, wherein the wafer-level package is installed on a circuit board, and at least a portion of the same management bus is routed on the circuit board.

8. A wafer-level package, fabricated in wafer-level process, comprising:
   an input/output (I/O) port, wherein the I/O port of the wafer-level package is arranged to connect only a single management bus;
   a first semiconductor die;
   a second semiconductor die, wherein each of the first semiconductor die and the second semiconductor die assembled in the wafer-level package is arranged to receive commands from the I/O port; and
   a communication channel, for connecting the first semiconductor die and the second semiconductor die, wherein the communication channel is a re-distribution layer (RDL) metal layer or a metal layer on a die.

9. The wafer-level package of claim 8, wherein the wafer-level package is an integrated fan-out (InFO) package.

10. The wafer-level package of claim 8, wherein the first semiconductor die and the second semiconductor are homogeneous dies.

11. The wafer-level package of claim 8, wherein each of the first semiconductor die and the second semiconductor die comprises a communication interface, the first semiconductor die and the second semiconductor die communicate with each other via a communication channel connected between communication interfaces of the first semiconductor die and the second semiconductor die, and the commands comprise calibration commands for calibrating the communication interfaces of the first semiconductor die and the second semiconductor die.

12. The wafer-level package of claim 8, further comprising:
   a substrate, arranged to carry the first semiconductor die and the second semiconductor die;
   wherein at least a portion of the single management bus is routed on the substrate.

13. A wafer-level package, fabricated in wafer-level process, comprising:
   an input/output (I/O) port, wherein the I/O port of the wafer-level package is arranged to connect only a single management bus;
   a first semiconductor die, arranged to receive commands from the I/O port and operate according to a first portion of the received commands;
   a second semiconductor die, arranged to receive a second portion of the received commands from the first semiconductor die; and
   a communication channel, for connecting the first semiconductor die and the second semiconductor die, wherein the communication channel is a re-distribution layer (RDL) metal layer or a metal layer on a die.

14. The wafer-level package of claim 13, wherein the wafer-level package is an integrated fan-out (InFO) package.

15. The wafer-level package of claim 13, wherein the first semiconductor die and the second semiconductor are homogeneous dies.

16. The wafer-level package of claim 13, wherein each of the first semiconductor die and the second semiconductor die comprises a communication interface, the first semiconductor die and the second semiconductor die communicate with each other via a communication channel connected between communication interfaces of the first semiconductor die and the second semiconductor die, and the commands comprise calibration commands for calibrating the communication interfaces of the first semiconductor die and the second semiconductor die.

17. The wafer-level package of claim 13, wherein the first semiconductor die is connected to the second semiconductor die via a channel inside the wafer-level package, and the first semiconductor die is arranged to re-direct the second portion of the received commands to the second semiconductor die via the channel.

18. The wafer-level package of claim 17, further comprising:
   a substrate, arranged to carry the first semiconductor die and the second semiconductor die;
   wherein the channel is routed on the substrate.

19. The wafer-level package of claim 13, further comprising:
   a substrate, arranged to carry the first semiconductor die and the second semiconductor die;
   wherein at least a portion of the single management bus is routed on the substrate.

20. The wafer-level package of claim 13, wherein the first semiconductor die is arranged to differentiate between the first portion of the received commands and the second portion of the received commands according to designated addresses of the commands.

* * * * *